US007397046B2

(12) United States Patent
Yue et al.

(10) Patent No.: US 7,397,046 B2
(45) Date of Patent: Jul. 8, 2008

(54) METHOD FOR IMPLANTER ANGLE VERIFICATION AND CALIBRATION

(75) Inventors: Duofeng Yue, Plano, TX (US); Jeffrey Loewecke, Wylie, TX (US); JieJie Xu, Plano, TX (US); Thomas Patrick Conroy, Carrollton, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/025,474

(22) Filed: Dec. 29, 2004

(65) Prior Publication Data

US 2006/0138355 A1    Jun. 29, 2006

(51) Int. Cl.
*G21K 5/10* (2006.01)
*H01J 37/08* (2006.01)
*A61N 5/00* (2006.01)

(52) U.S. Cl. .............................. 250/492.21; 250/492.1; 250/492.3

(58) Field of Classification Search .............. 250/492.21
See application file for complete search history.

(56) References Cited

U.S. PATENT DOCUMENTS 4,587,432 A * 5/1986 Aitken ..................... 250/492.2
6,828,572 B2 * 12/2004 Reece et al. ........... 250/492.21

OTHER PUBLICATIONS

*Silicon Processing for the VLSI Era. vol. 1—Process Technology*, "Measurement of the Electrical Properties of Thin Films" S. Wolf and R.N. Tauber, Copyright 1986 by Lattice Press, pp. 119-122 and 267-269.
*Ion Implantation Science and Technology*, "Modulated Reflectance Maps", edited by J.F. Ziegler, Copyright 2000, pp. 318-320 & 322.
*Ion Implantation science and Technology*, edited by J.F. Ziegler, Copyright 2000. pp. 93-94.

* cited by examiner

*Primary Examiner*—David A. Vanore
(74) *Attorney, Agent, or Firm*—Wade J. Brady, III; Frederick J. Telecky, Jr.

(57) ABSTRACT

Methods (300, 400) are described for calibrating the implantation angle of an ion implanter utilized in the manufacture of semiconductor products. One method (300) includes implanting (330) phosphorous ions into a pilot wafer held by a wafer platen held at a starting implantation angle in the ion implanter. The phosphorous implantation into a p-doped substrate of the pilot or blank wafer, for example, forms a semiconductive sheet. The method (300) then includes changing the implantation angle (340), and implanting another wafer (330) with phosphorous ions. The angle changing (340) and implanting (330) of other wafers continues in this manner until all wafers or angles are implanted (350) as desired. The phosphorous implanted wafers are then measured (360) with a four-point probe, for example, to obtain the sheet resistance of all the implanted wafers. The difference between the sheet resistances of the wafers at each corresponding implant angle is then obtained (370) to determine a functional relationship between the sheet resistance and the implantation angle. Finally, the functional relationship is then used to calibrate (380) the implantation angle of the implanter. For example, the lowest sheet resistance of the functional relationship may be determined, the relationship normalized to the lowest sheet resistance, then a zero degree implantation angle of the implanter is calibrated to to coincide with the lowest sheet resistance measurement.

20 Claims, 9 Drawing Sheets

FROM 310 OF FIG. 3A

PROVIDE ONE OR MORE PILOT WAFERS FOR IMPLANTING AT EACH OF THREE OR MORE TEST ANGLES, STARTING AT AN ANGLE OF ABOUT ZERO DEGREE —320

FROM 350 OF FIG. 3A

MEASURE $R_s$ AT ONE OR MORE POINTS ON A WAFER USING A FOUR-POINT PROBE, AND AVERAGE TWO OR MORE $R_s$ MEASUREMENTS OF THE WAFER —362

REPEAT $R_s$ MEASUREMENT FOR ALL WAFERS —364

FROM 360 OF FIG. 3A

DETERMINE LOWEST $R_s$ VALUE AND CALCULATE $R_s$ DELTA BETWEEN WAFERS AT EACH ANGLE CHOSEN —372

CALCULATE PLATEN ORIENTATION —374

METHOD FOR IMPLANTER ANGLE VERIFICATION AND CALIBRATION

FIELD OF INVENTION

The present invention relates generally to semiconductor devices and more particularly to a method for calibrating the angle of implantation of an ion implanter utilized in the manufacture of semiconductor products.

BACKGROUND OF THE INVENTION

Ion implantation systems are used to impart impurities, known as dopant elements, into semiconductor substrates or wafers, also referred to as workpieces. In such systems, an ion source ionizes a desired dopant element, and the ionized impurity is extracted from the ion source as a beam of ions. The ion beam is directed (e.g., swept) across respective wafers to implant ionized dopants within the wafers. The dopant ions alter the composition of the wafers causing them to possess desired electrical characteristics, such as may be useful for fashioning particular semiconductor devices, such as transistors, upon the substrates.

The continuing trend toward smaller electronic devices has presented an incentive to "pack" a greater number of smaller, more powerful and more energy efficient semiconductor devices onto individual wafers. Moreover, semiconductor devices are being fabricated upon larger wafers to increase product yield. For example, wafers having a diameter of 300 mm or more are being utilized so that more devices can be produced on a single wafer. This necessitates careful monitoring and control over semiconductor fabrication processes, including the angle at which the ions are implanted in the wafer.

However, as these device and wafer scaling trends continue, any errors in the implantation angle tend to play a more important role, proportionately, in the electrical characteristics of such devices. For example, such implantation angle errors may be introduced by mechanical misalignment in the implanter and wafer orientation. Other angle errors may be produced because of a divergence of the ion beam or another such angular non-uniformity produced by the implanter between the center and the outer edge of the wafer, sometimes referred to as a "cone angle".

Further, angle errors or angle variations in halo implants result in misplaced pockets or halos that produce variations in the drive current (Idrive) and threshold voltage (Vt). Because of the misplaced pocket implants, MOS devices often experience a change in the effective gate length $Lg_{eff}$, a depressed MPY, and other similar channel effects that dramatically alter the electrical parameters of a device. For example, a one degree incident angle variation in the pocket implant of a 90 nm technology device may produce more than a 25% change in one or more electrical parameters of the device. Thus, as devices are highly scaled, angle variations in pocket implants, for example, can play a more important role than dose variations.

Traditionally, such errors in the implantation angle are not detected until the end of the production line in the device parametric data, or by use of expensive additional monitoring equipment. Detection of angular errors at the end of the line after numerous steps have been accomplished tends to cloud the true results. A manual method is also used to measure the implantation angle by performing a physical check, with an angle-measuring ruler according to a vendor recommended procedure. This method, however, may not be accurate enough for many increasingly scaled applications.

One common method of measuring the implantation angle is by the use of modulated reflectance mapping, such as is utilized in Thermawave monitoring equipment. The signal from this technique is expressed in arbitrary "thermawave" (TW) units, which are proportional to implant-induced damage of the silicon crystalline lattice. In this technique, damage tends to increase as the implanter ion beam is tilted off a zero degree (0°) tilt axis or perpendicular to the surface of the wafer. However, as numerous other factors such as variations in the process temperature and ion beam current density also affect damage in the lattice, this technique may lack adequate sensitivity and add unnecessary equipment cost.

Accordingly, as MOS devices are scaled down to support future technologies, it has become increasingly important that the implantation angle be accurately monitored, and that the angle be symmetrically produced, for example, about the zero angle. Thus, there is a need for a method of calibrating the implantation angle of an ion implanter wherein pocket implantations may be improved and effective gate length variations may be mitigated in pocket implantations in the manufacture of semiconductor devices.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later. The invention relates to methods of calibrating or characterizing the implantation angle of an ion implanter wherein the sheet resistance of phosphorous implanted pilot wafers are measured to accurately determine the implantation angle of the ion beam in the fabrication of semiconductor devices. The method is applicable to single wafer and multi-wafer batch implanters.

In one aspect of the invention, one or more (preferably several) lightly P-type doped wafers are implanted with phosphorous ions at various implantation angles around zero degree implant angle. Here, the zero degree implantation is defined as the ion beam is perpendicular to the wafer surface. After several wafers and angles are implanted in this way, for example, the sheet resistance of the wafers is measured at several points with a four-point probe. The lowest resistance measurements correlate to the lowest angle variation from the zero degree implantation angle, and differences from this lowest resistance measurement value are proportional to the implantation angle. A functional relationship may then be set forth between the average resistance change (relative to the lowest resistance value) and the implant angle. The function derived, or another such proportionality correlation to the resistance vs. angle data, can then be used to calibrate, for example, the wafer platen angle of an ion implanter.

Thus, due to the angular implantation sensitivity of phosphorous in a lightly Boron-doped substrate of silicon, it is possible to subsequently measure the sheet resistance of a wafer and determine an implantation angle according to one exemplary aspect of the invention.

One benefit of the present invention is that the angular sensitivity of phosphorous as a function of resistance is greater than that of the modulated laser reflectance mapping methods that rely on lattice damage. Further, the method of the present invention provides more reliable and accurate results than Thermawave type measurements considering the various peripheral factors that influence lattice damage.

In one aspect of the present invention, the one or more points (e.g., about 50 points) on the wafers are measured with a four-point probe and averaged together as a single resistance representative of the implantation angle used on the wafer.

In another aspect of the present invention, the implantations are accomplished during normal down-times of the implanter such as daily dose qualification processing or during periodic preventative maintenance of the implanter. For example, one or two new implant angles may be tested each day on several wafers during dose qualification runs. After a week or two of such wafer implantations, adequate sheet resistance measurement data may be available to fine-tune the wafer platen calibration of the implanter. Subsequently, additional measurement data may supply further fine-tuning calibration information.

In still another aspect of the invention, the phosphorous implantation dose is about 1E12 ions/cm$^2$ or more and about 5E15 ions/cm$^2$ or less.

In yet another aspect of the present invention, the implantation energy is about 5 KeV or more and about 3000 KeV or less.

In one implementation, for example, the phosphorous implantation comprises a dose of about 1E12 to about 5E15 ions/cm$^2$ and an implantation energy of about 5 KeV to about 3000 keV, and preferably the implantation condition is about 150 KeV/1E14 dose/0 tilt/0 twist.

In one example of the present invention, three or more wafers are implanted at each angle implanted to provide adequate characterization data.

In another example of the present invention, the sheet resistance measurements of the implanted wafers are plotted to develop a functional relationship between the resistance values and the implantation angles. The lowest of the sheet resistance data is determined and the plot normalized to the lowest resistance value, and the zero degree implantation angle of the implanter is calibrated to coincide with the lowest sheet resistance value plotted.

In the past, implantation angles were measured manually with angle rulers, or indirectly by way of end-of-line parametric data with generally inadequate resolution. Subsequent attempts to monitor implantation angles using expensive conventional monitoring equipment has resulted in unreliable or confusing results, compared to that which may be achieved by the present invention. In addition, some aspects of the present invention have further been found to provide significant improvement in reducing variations in the effective gate length Lgeff produced during halo implants. The method, moreover, may advantageously achieve significantly minimized short-channel effect variations in device electrical parameters including Idrive and Vt and other such parameters.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

DETAILED DESCRIPTION OF THE INVENTION

The present invention will now be described with reference to the attached drawings, wherein like reference numerals are used to refer to like elements throughout. The invention provides a method for implanter angle verification or calibration in the manufacture of semiconductor devices, wherein phosphorous ions implanted in pilot wafers are used to characterize the angle of the implant based on four-point probe measurements of the sheet resistance of the wafers implanted at various angles. Once the $R_S$ vs implant angle characterization is complete for the implanted wafers, the implanter may then be calibrated according to the characterization relationship, or the implant angle may otherwise be verified.

The inventors of the present invention have discovered that the sheet resistance $R_S$ of the phosphorus wafer implants is highly sensitive to angle variation (angle offset) or misalignment from the zero angle (0°), wherein the sheet resistance increases proportionally as the offset from the zero angle increases. Exemplary implementations are hereinafter illustrated and described in the context of fabricating and implanting semiconductor device wafers and MOS transistors with phosphorous ion implantation, wherein the structures illustrated are not necessarily drawn to scale. It will be appreciated that the invention may be employed in angle verification and calibrating the implant angle of single wafer and multi-wafer batch implanters, as well as in calibrating or verifying other implantation operations and devices apart from the exemplary structures illustrated herein. These and other benefits will become more apparent as the following figures are described. The following discussion will further establish some of the problems and issues relating to semiconductor fabrication associated with implantation and the implant angle.

MOS transistors, for example, include a conductive gate overlying a channel region of the substrate with a thin gate dielectric, typically oxide, therebetween. Source and drain regions of the substrate (sometimes referred to as junction regions) are doped with impurities on opposite sides of the channel, wherein the source/drain regions of nMOS devices are doped with n-type impurities (e.g., As, Sb, P, etc.) and pMOS devices are doped using p-type impurities (e.g., B, Ga, In, etc.). The length of the gate structure overlying the channel is typically referred to as the physical channel length. The source and drain dopants are typically implanted into the silicon substrate using ion implantation systems, wherein the dosage and energy of the implanted ions may be varied depending upon the desired dopant concentration, depth, and profile. The ion dose generally controls the concentration of implanted ions for a given semiconductor material, and the energy level of the beam ions determines the distance of penetration or depth of the implanted ions (e.g., the junction depth).

Following implantation, the dopant atoms in the source/drain regions occupy interstitial positions in the substrate lattice, and the dopant atoms must be transferred to substitutional sites to become electrically active. This process is sometimes referred to as "activation", and is accomplished by high temperature annealing in an inert ambient such as argon. The activation anneal process also causes diffusion of implanted dopant species downward and laterally under the gate in the substrate, wherein the effective channel length becomes less than the physical channel length. As device sizes continue to shrink, the physical and effective channel lengths continue to be scaled downward, wherein short channel effects become significant.

In addition to short channel effects, hot carrier effects are also experienced in short channel devices. For example, during saturation operation of a MOS transistor, electric fields are established near the lateral junction of the drain and channel regions. This field causes channel electrons to gain kinetic energy and become "hot". Some of these hot electrons traveling to the drain are injected into the thin gate dielectric proximate the drain junction. The injected hot carriers, in turn, often lead to undesired degradation of the MOS device operating parameters, such as a shift in threshold voltage, changed transconductance, changed drive current/drain current exchange, and device instability.

As indicated previously, while wafers and semiconductor devices are being scaled to support future technologies, it has become increasingly important that the implantation angle be accurately monitored, and that the implant angle be symmetrically produced, for example, about the zero angle.

Figure 1A:
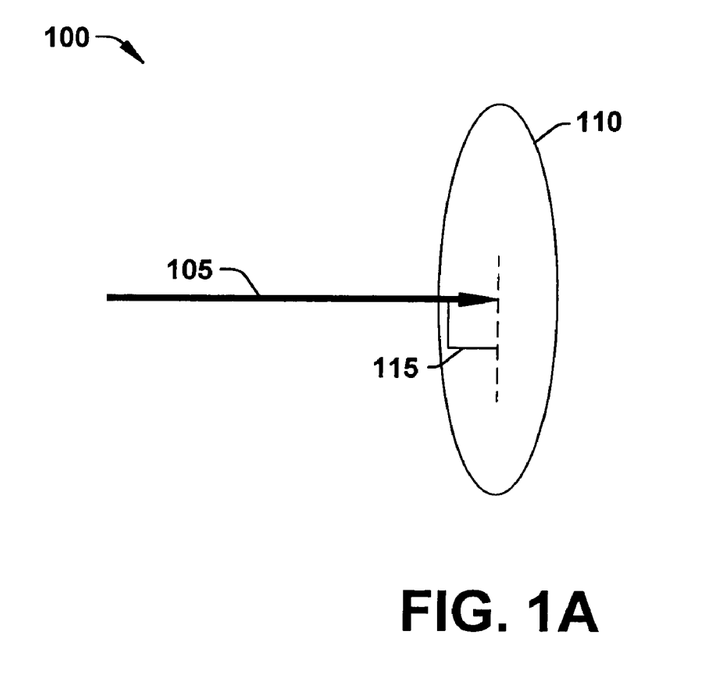
FIG. 1A is a simplified view of an ion beam being implanted into a wafer at a zero degree implantation angle such as may take place within an ion implanter used in association with the present invention, wherein the ion beam is implanted perpendicular to the surface of the wafer.

FIG. 1A, for example, illustrates a simplified ion beam implantation 100 such as may take place within an ion implanter used in association with the present invention. Implantation 100 illustrates an ion beam 105 being implanted into a wafer 110 at a zero degree angle, wherein the axis of the ion beam is perpendicular 115 to the surface of the wafer 110. For numerous implantation processes it is desirable that the ion beam remain perpendicular to the wafer for maximum dopant penetration depth and for the success of various masking operations during implantation.

Figure 1B:
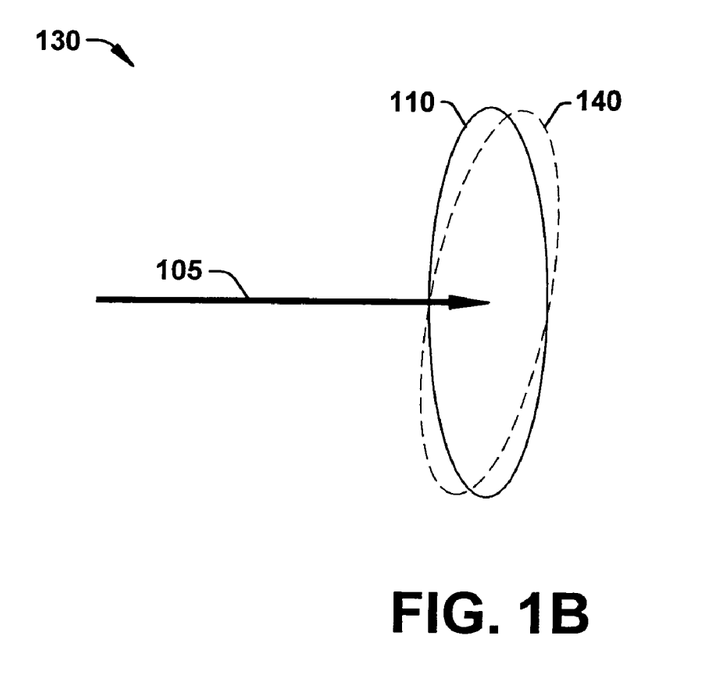
FIG. 1B is a simplified view of an off-axis ion beam implantation into a wafer such as may take place within an ion implanter used in association with the present invention, wherein the wafer is angled or tilted with respect to the axis of the ion beam, and such as may occur during mechanical misalignment.

FIG. 1B illustrates an off-axis ion beam implantation 130, wherein the wafer 110 is angled or tilted 140 with respect to the axis of the ion beam 105 such as may occur, for example, during mechanical misalignment of the implanter.

Figure 2A:
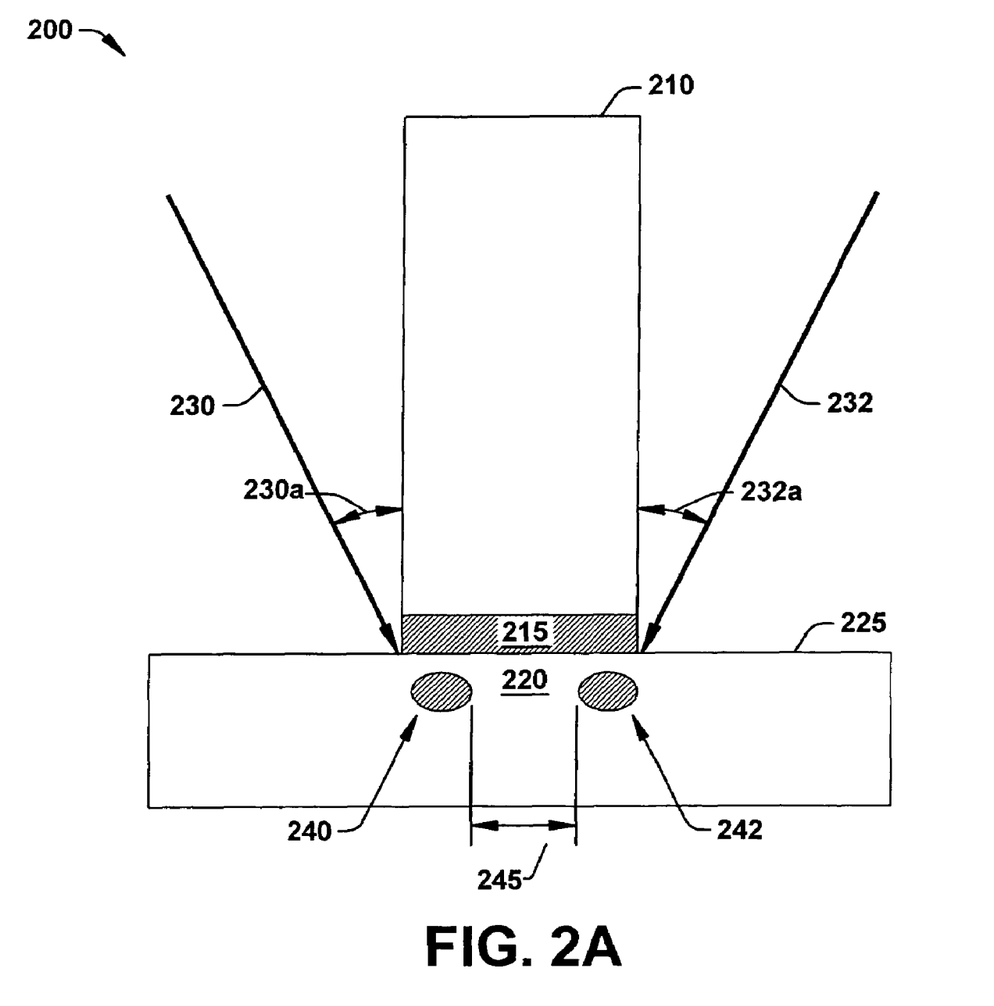
FIG. 2A is a cross sectional side view of a MOS transistor during two rotations of an angled pocket implant, wherein the angles are generally symmetrical.

FIG. 2A illustrates a MOS transistor 200 during two rotations of an angled pocket implant, wherein the pocket implantation angles are symmetrical. Transistor 200 comprises a gate 210 overlying a gate oxide layer 215 disposed overlying a channel region 220 within a semiconductor substrate 225. The pocket implant typically comprises two wafer rotations or two angled implants 230 and 232 having angles 230a and 232a, respectively, underlying the gate oxide 215 within the channel region 220. The two angled implants 230 and 232 of the pocket implantations form halos or pockets 240 and 242, respectively, within the channel region 220. As discussed above, the spacing between these pockets 240 and 242 will, in part, determine the channel length 245 of the transistor 200, which will in turn affect the Idrive and Vt electrical parameters of the device.

Figure 2B:
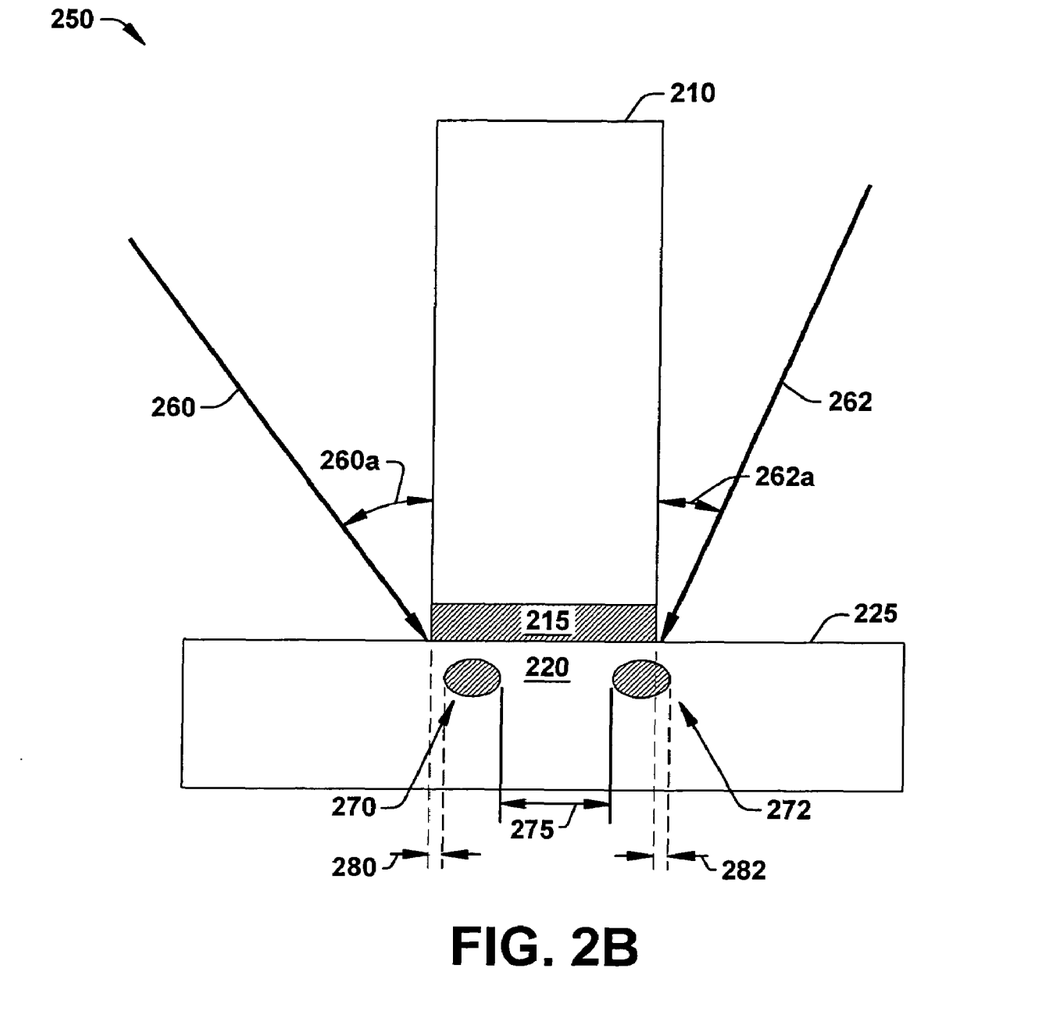
FIG. 2B is a cross sectional side view of a MOS transistor during two rotations of an angled pocket implant, wherein the angles are not symmetrical.

FIG. 2B illustrates a similar MOS transistor 250 during two rotations of an angled pocket implant, wherein the pocket implantation angles are not equal or symmetrical about the zero angle. The ion beam pocket implants may be unequal due to mechanical misalignment, cone angle effects or another such reason resulting in misplaced pocket implants. Similar to that of FIG. 2A, the pocket implant comprises two wafer rotations or two angled implants 260 and 262 having angles 260a and 262a, respectively, extending underlying the gate oxide 215 within the channel region 220. The two angled implants 260 and 262 of the pocket implantations form halos or pockets 270 and 272, respectively, within the channel region 220. Again, the spacing between these pockets 270 and 272 will, in part, determine the channel length 275 of the transistor 250, which will in turn affect the Idrive and Vt electrical parameters of the device. Since the implantation angles 260a and 262a of the ion beam are different from that of FIG. 2A, the placement of pockets 270 and 272, respectively, may also be different as indicated by pocket offset spacings 280 and 282, respectively.

Accordingly, the channel length 275 of transistor 250 may be different than that of FIG. 2A resulting in a dramatically different Idrive and Vt. Such variations in implantation angle alignment may cause device parameters to also vary substantially. For example, in a 90 nm technology, an angle variation of only 1 degree may produce ion shifts of 20 µa/µm, consuming more than 25% of an allowable PCD parameter range. This level of variation in a pocket implant angle may have a larger effect on the device than that of dose variations. Thus, there is a continuing need to monitor and calibrate implanters to maintain accurate and consistent implantation angles.

To keep pace with transistor scaling and in response to such parameter shifts as a result of angle variations, the present invention is presented. One aspect of the invention provides methods for characterizing the implantation angle using the measured sheet resistance of phosphorous P implanted into a wafer (e.g., a blank or pilot wafer) in order to calibrate the implantation angle of an implanter (e.g., a single or batch wafer implanter).

One or more wafers may be implanted with the phosphorous at a variety of test angles, preferably in association with daily dose qualifications or during periodic maintenance of the implanter. The sheet resistance $R_S$ of the phosphorous implanted wafers may then be measured (e.g., at multiple locations) on each implanted wafer, for example, using a four-point probe. The inventors of the present invention have observed that the lowest sheet resistance (nominally about 275 ohms/sq) generally occurs at a zero degree implantation angle, and that the $R_S$ angular sensitivity remains relatively flat over an investigated 1E13 to 1E14 ions/cm$^2$ dose range and implantation energy level range of about 20 KeV to about 200 KeV when measured at 0° tilt and 0° twist. Beneficially, the sheet resistance $R_S$ sensitivity due to the twist angle of the lattice structure of the wafers, however, is also relatively flat for all twist angles.

The average of these sheet resistance $R_S$ values may be, for example, plotted against the implantation angle to develop a functional relationship between the implantation angle and sheet resistance. The lowest sheet resistance value may then be used to determine, verify, or calibrate the zero degree implantation angle, for example, of the wafer platen of an ion implanter. Further, two angled implants may be accurately measured and compared in this way to verify or calibrate the pocket implants of an implanter.

One such method 300 is illustrated in FIGS. 3A thru 3D, representing several variations of the method for characterizing the implantation angle in accordance with several aspects of the present invention. Although the exemplary method 300 is illustrated and described hereinafter as a series of acts or events, it will be appreciated that the present invention is not limited by the illustrated ordering of such acts or events. In this regard, some acts may occur in different orders and/or concurrently with other acts or events apart from those illustrated and/or described herein, in accordance with the invention. In addition, not all illustrated steps may be required to implement a methodology in accordance with the present invention. It is further noted that the methods according to the present invention may be implemented in association with the wafers and transistor devices illustrated and described herein as well as in association with other apparatus and structures not illustrated.

Method 300 comprises an exemplary implanter angle characterization that may be used in the fabrication of semiconductor device wafers, the method beginning at 310. Pilot or blank wafers for testing may be provided at 320 for implanting at several angles, for example, starting at or about the zero degree angle for receiving the phosphorous implantations. The wafers provided may have been previously lightly doped with a p-type dopant for the subsequent P implantation (n-type implant) at the tested implant angle. As indicated at 320 of FIG. 3B, one or more pilot wafers may be implanted at one of three or more different test angles starting at about zero degrees, as this angle is most commonly used and provides a particularly identifiable angle where the sheet resistance $R_S$ is at a lowest value.

Returning to FIG. 3A, the one or more wafers are implanted with phosphorous at a starting angle at 330, for example, at an implantation dose of about 1E12 to 5E15 ions/cm$^2$, such as about 1E14 ions/cm$^2$, and employing an implantation energy of, for example, about 5 keV to about 3000 keV, such as about 150 keV. The P implantation forms a conductive sheet layer within the wafer(s) of the implanter. At 340 the implant angle is changed, for example, by 0.2°, 1.0°, or other angle increment to another predetermined angle, and other wafers are implanted with phosphorous at 330 until at 350 all the predetermined test angles or wafers are implanted with phosphorous in this way.

Once all the wafers are implanted at 350, sheet resistance $R_S$ measurements may be made at 360. For example, at 362 of FIG. 3C sheet resistance $R_S$ measurements may be made at multiple sites on a wafer using a four-point probe (usually 49 points or more) and then averaging these $R_S$ measurements for the wafer. At 364 of FIG. 3C the $R_S$ measurements should be performed for all the wafers implanted at the various angles.

Figure 3A:
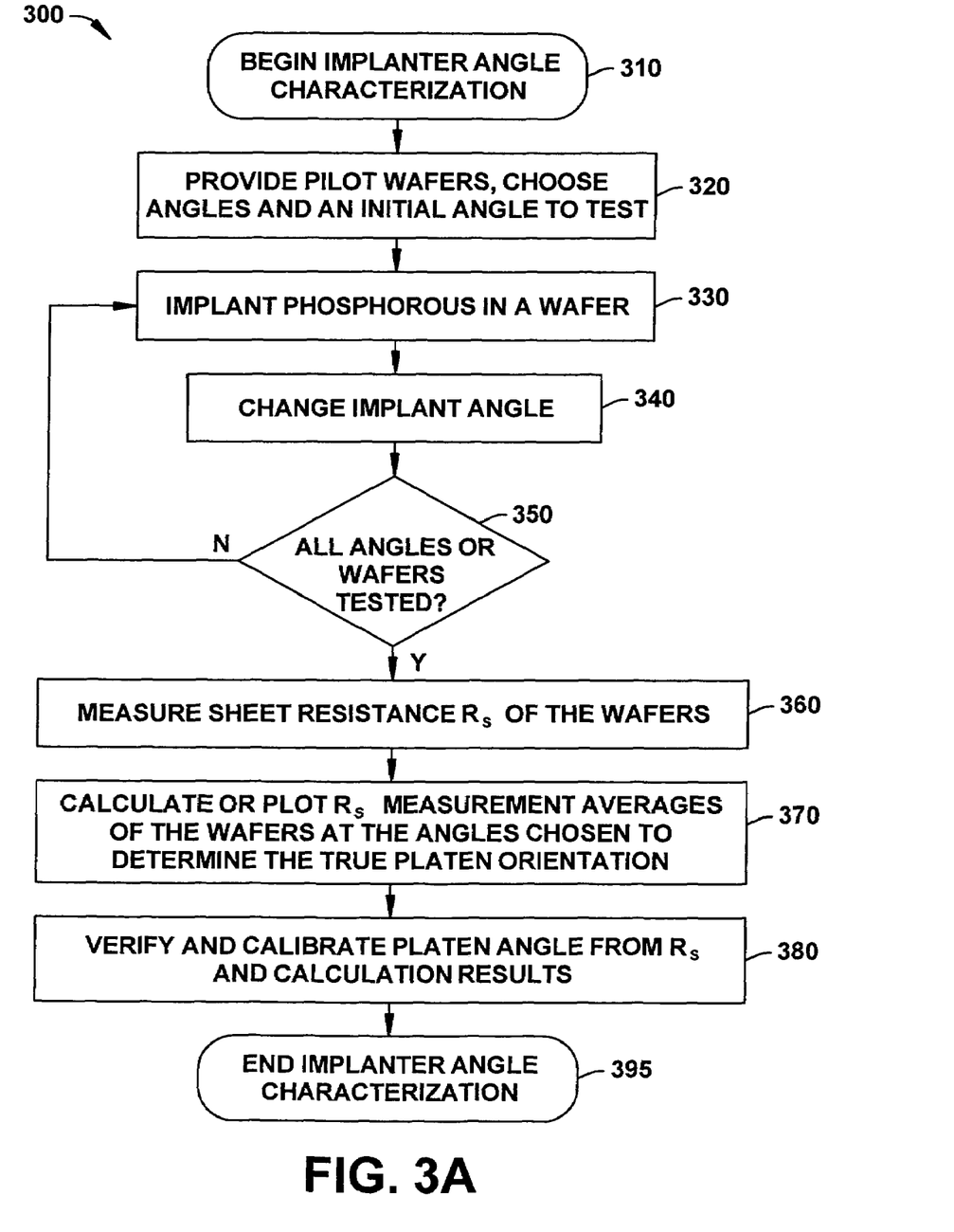
FIGS. 3A-3D provide flow diagrams illustrating an exemplary method of characterizing the angle of implantation in an implanter in accordance with one or more aspects of the present invention.
Figure 3B:
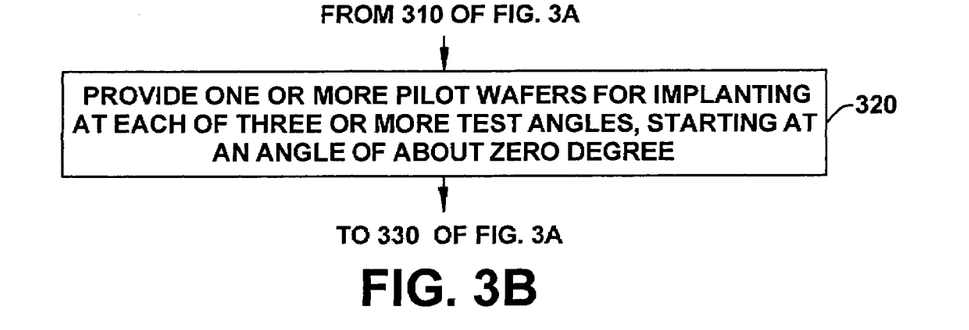
Figure 3C:
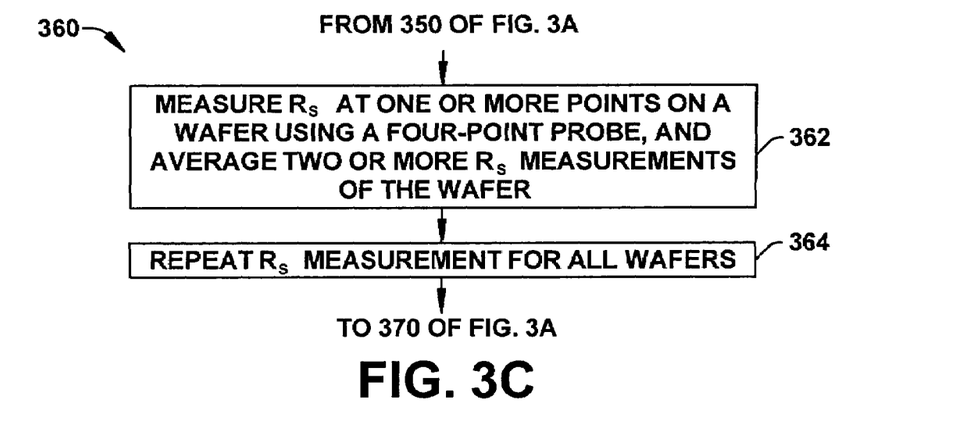
Figure 3D:
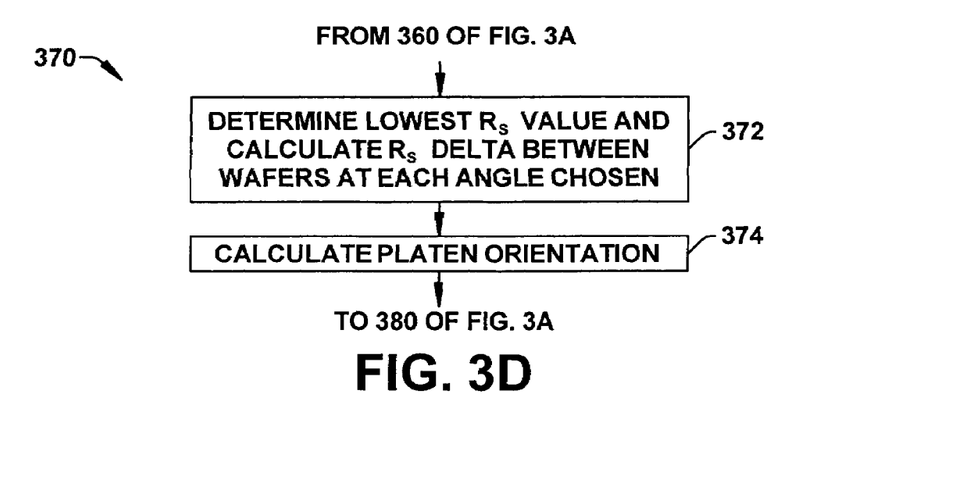

Returning to FIG. 3A, at 370 the $R_S$ measurement averages of all wafers implanted with different implant angles should be, for example, calculated or plotted vs. implant angles to find the minimum Rs point by interpolation method which corresponding to the real zero implant angle (e.g., as indicated at 372 of FIG. 3D). The delta of the interpolated lowest Rs point to the current zero angle is the angle shift of the implanter platen. This relationship is similar to that of the plot of FIG. 6, which will be discussed further infra. Finally, after the relationship has been characterized, the implanter platen angle may be adjusted accordingly.

Figure 4:
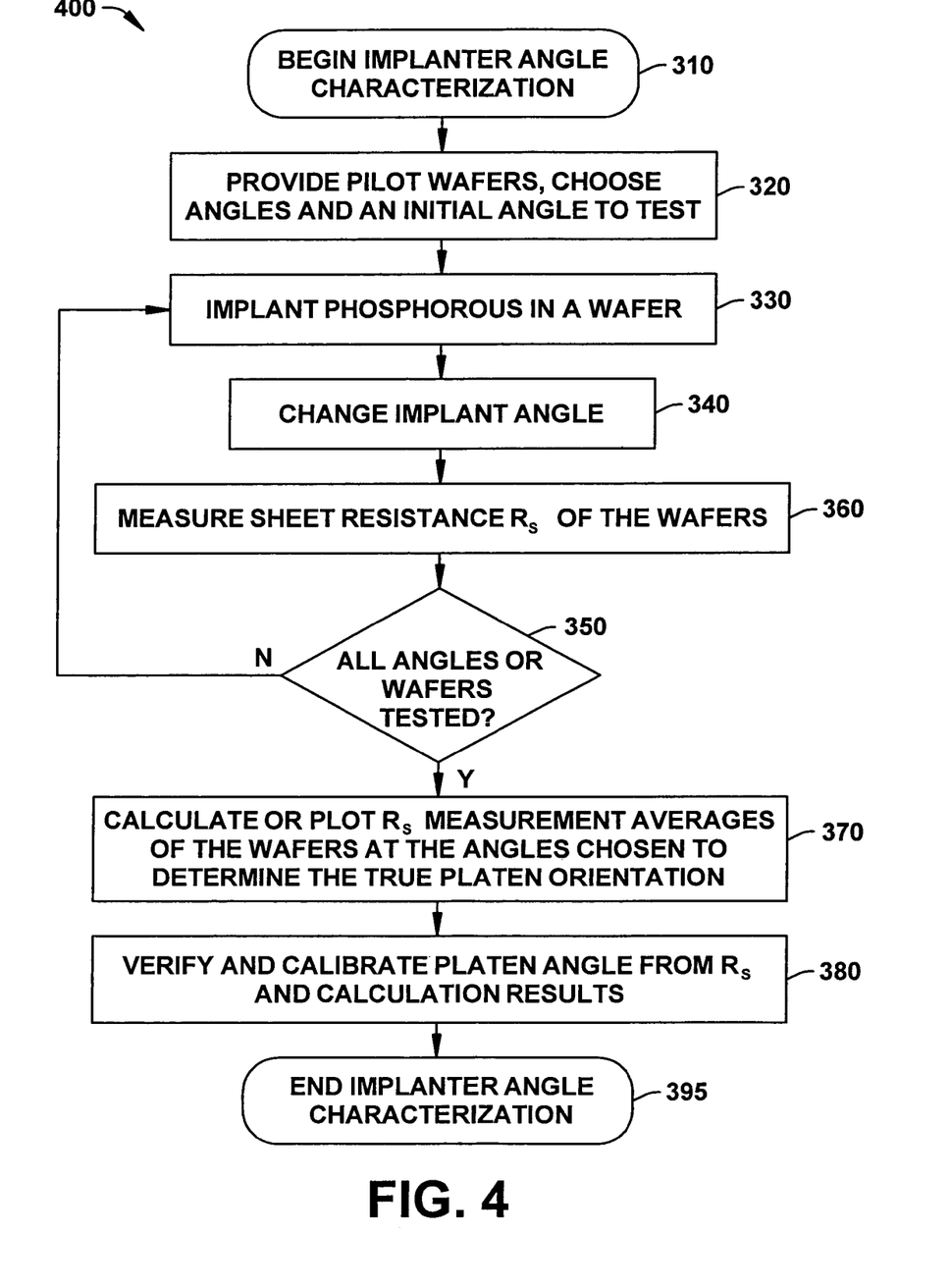
FIG. 4 is a flow diagram illustrating an alternate exemplary method of characterizing the angle of implantation in an implanter in accordance with one or more aspects of the present invention.

FIG. 4 illustrates an alternate exemplary method 400 of characterizing the angle of implantation in an implanter in accordance with one or more aspects of the present invention. Method 400 is similar to method 300 of FIGS. 3A-3D, and as such need not be completely described again for the sake of brevity, except where noted. For example, while the ordering of step 360 in FIG. 3A indicates that the $R_S$ measurements of the wafers may be accomplished after all the wafers are implanted, method 400 of FIG. 4 illustrates that the step of measuring the sheet resistance $R_S$ of the wafers at 360 may also be accomplished as each batch of wafers or implantation angle is tested.

Figure 5:
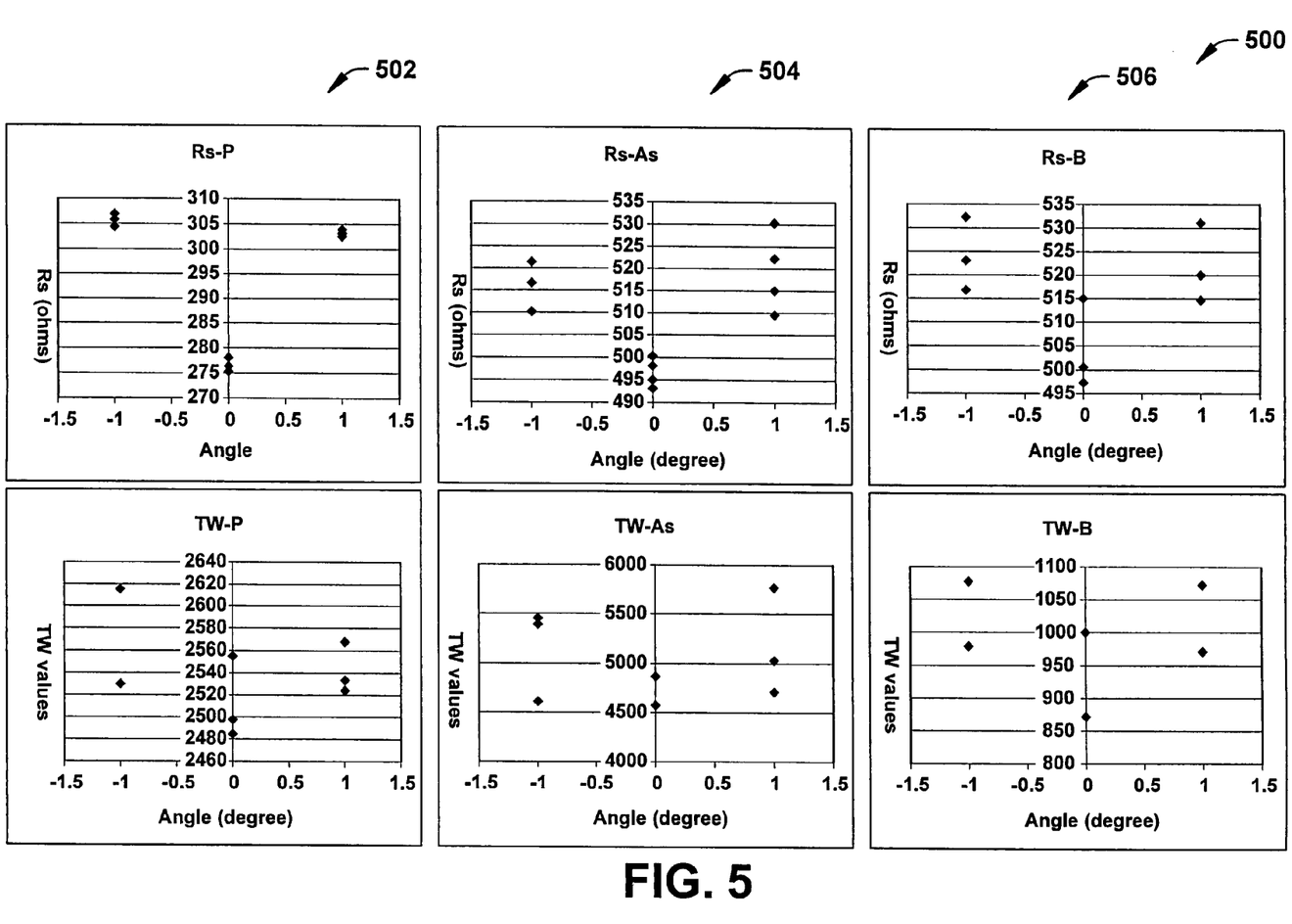
FIG. 5 illustrates plots comparing the angle sensitivity of sheet resistance measurements to that of TW values for several dopant ion species as may be detected following implantation in accordance with one or more aspects of the present invention.

FIG. 5 illustrates plots 500 comparing the angle sensitivity of sheet resistance measurements $R_S$ (upper three plots) in accordance with the methods of the present invention to the angle sensitivity of TW values (lower three plots) for several dopant ion species as may be detected following implantation. In particular, plot 502 demonstrates an $R_S$ change of about 10.1% in $R_S$ value per degree of implant angle change about the zero degree implantation angle, yet maintains a low standard deviation (e.g., about 1.44) as reflected in the tight data grouping for P relative to As, or B dopants illustrated in plots 504, and 506, respectively.

The inventors have discovered that the method of the present invention is capable of controlling the accuracy of the implant angle to less than 0.2 degrees using the $R_S$ of phosphorous for calibration. Conversely, the Thermawave TW angle sensitivity values of the lower three plots demonstrate inadequate sensitivity and stability to detect such slight implanter wafer platen angle variations, particularly as future trends continue. In addition, the methods of the present invention provide rapid platen angle feedback relative to the long feedback delay associated with the use of parametric data.

Figure 6:
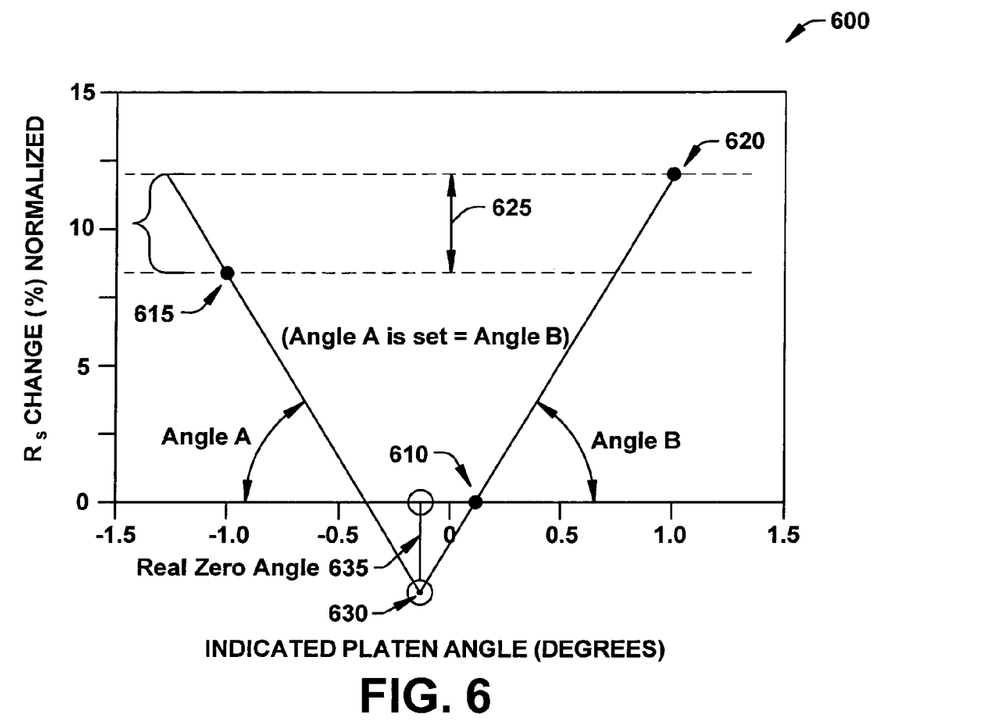
FIG. 6 is a plot of the implant angle characterization as a function of the average sheet resistance change and the angle implanted, the function normalized to the lowest measured sheet resistance in accordance with one or more aspects of the present invention.

FIG. 6 illustrates a plot of an implant angle characterization or function 600 of the average sheet resistance change and the angle implanted as may be generated using the method (300, 400) of the present invention. The function 600 of this relationship may be normalized to the lowest measured sheet resistance $R_S$ 610 in accordance with one or more aspects of the present invention. For example, the lowest $R_S$ of plot 502 of FIG. 5 is about 275 ohms/sq, and may be normalized to the $R_S$ 0% change level 610. All other angle $R_S$ measurements are then differential values relative to the 275 ohms/sq value corresponding to the $R_S$ 0% change level 610. As indicated previously, this leaves the +/−1 degree values as having an average difference of about 10.1% change in $R_S$ relative to the lowest measured sheet resistance $R_S$ 610 at the indicated zero degree platen angle in one implementation of the invention.

For example, if a lower $R_S$ measurement 615 represents an $R_S$ change of about 8%, and an upper $R_S$ measurement 620 represents an $R_S$ change of about 12%, then an imbalance or deviation 625 between the lower and upper measurements indicates that the actual zero degree implantation angle may be different than the current platen angle used. Thus, the platen angle may be adjusted to another value until the real zero degree angle corresponds to the lowest sheet resistance value and the deviation between equally spaced upper and lower measurements have minimal imbalance 625. Accordingly, the inventors of the present invention have discovered that the identification of such an imbalance 625 suggests employing at least three $R_S$ measurements to identify the true zero degree implantation angle.

In one aspect of the present invention, the real zero angle may be estimated graphically, for example, by plotting two sides of an angle thru the three measured points 610, 614, and 620 of FIG. 6, where angle A=angle B. Where angles A and B are found to intersect, at intersection 630, the indicated platen angle corresponds to the real zero angle 635 for the platen. For example, given the exemplary points shown in FIG. 6, the real zero angle 635 corresponds to an indicated platen angle of approximately −0.15 degrees. This calibration correction may then be made to the implantation system and other such calibration measurements made to further fine-tune the system.

When a batch or lot of wafers are cut from a silicon ingot, the wafers may possess a variation in the cut direction, cut thickness or cut angle that is different from that which was expected, resulting in a wafer cut error. The method and techniques implemented in the present invention may further be applied to determine and isolate such wafer cut errors from those of the implantation angle errors previously described. For example, the method may be implemented utilizing at least three wafers of a specific cut lot to determine the three data points illustrated in FIG. 6 and to determine the real zero angle 635 correction required. Subsequently, to determine what part of this correction may be due to a possible wafer cut error, three other wafers of the same cut lot may be also implanted and measured in accordance with the method. This time, however, the three wafers may, for example, be rotated 180° relative to the first set of three wafers, to reveal any wafer cut errors.

The real zero angle 635 correction results of the second set of wafers would then be compared to the angle correction results of the first set of wafers to determine the relative effects of the implanter and the wafer cut errors for the lot. For example, if the results of the first wafer set yielded an angle correction of −0.4 degrees, while the results of the second wafer set rotated 180° indicated an angle correction of −0.2 degrees, it may be concluded that the cut error is about half of the implanter error (e.g., about +/−0.1 degrees). Thus, this second set of data may be used to determine that the implanter actually only needs to be corrected by −0.3 degrees. In another example, if the first result from the first set of three (or more) wafers indicated a correction of +0.2 degrees, and the second result from the second set of three or more wafers indicated a correction of −0.2 degrees, it may be concluded that the implanter requires no angle correction, and that our wafer cut error is about +/−0.2 degrees.

Figure 7:
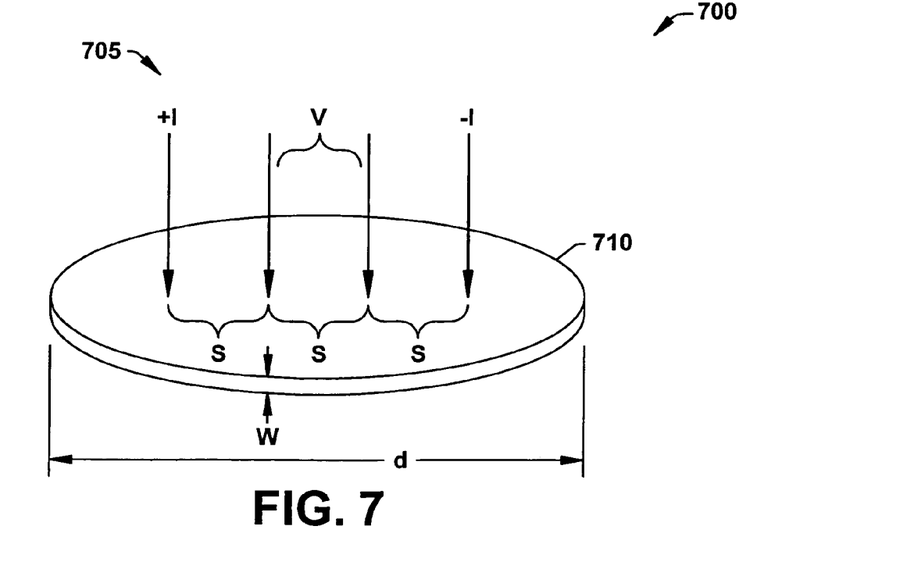
FIG. 7 is a simplified diagram of a four-point probe measuring scheme as may be applied to wafer resistance measurements used in accordance with the present invention of FIGS. 3A-3D, and 4.

FIG. 7 illustrates a four-point probe measuring scheme 700 as may be applied to wafer resistance measurements used in accordance with the methods of the present invention of FIGS. 3A-3D and FIG. 4. The sheet resistance $R_S$ of an implanted or diffused layer is the resistance exhibited in a square region of equal length and width. The value of $R_S$ is expressed in units of ohms/sq, and is obtained by measuring the resistance of the diffused layer using a four-point probe 705. FIG. 7 shows the collinear probe arrangement that is the basis for the ASTM standard, which has been developed for conducting measurements of $R_S$. To make the measurement, a current, I, is forced between the outer two probes (e.g., +I and −I), and the voltage drop, V, between the two inner probes (e.g., V) is measured. To prevent erroneous readings, measurement is performed first with the current in the forward direction, then with the current in the reverse direction. The two voltage readings are averaged, and measured at several current levels until a proper level is found.

The sheet resistance $R_S$ is calculated from the measured values of current and voltage by the expression:

$$R_S = (V/I)F_1$$

where $F_1$ is a correction factor depending on the geometry of the probes (spacing between the probes) relative to the specimen thickness, and distance of the probes from the edge of the specimen. For a circular wafer of FIG. 7, s is the average interprobe spacing (usually 30-70 mils), d is the wafer diameter, and W is the thickness of the wafer. The manufacturer of the four-point probe 705 that is utilized will usually provide tables for the correction factors and other such information necessary to enable the $R_S$ measurements.

As previously indicated, $R_S$ measurements may be taken at many points across each wafer implanted at the various implant angles. The $R_S$ measurements are particularly beneficial in the context of the present invention, when the measurements are averaged for each wafer and/or group of wafers that may be implanted at the same implant angle. For example, in plot 502 of FIG. 5, each of three wafer $R_S$ averages provides a single data point at each of three implant angles for a total of nine data points. Many more data points may then be added over a period of time, such as during daily dose qualifications or during periodic preventative maintenance of the implanter. For example, it may be desirable to verify several more implanter platen angles substantially closer to the zero degree angle to insure that the 275 ohms/sq measurement is actually the lowest $R_S$ available. If another measurement is found, for example, then the wafer platen calibration may be fine-tuned further.

Figure 8:
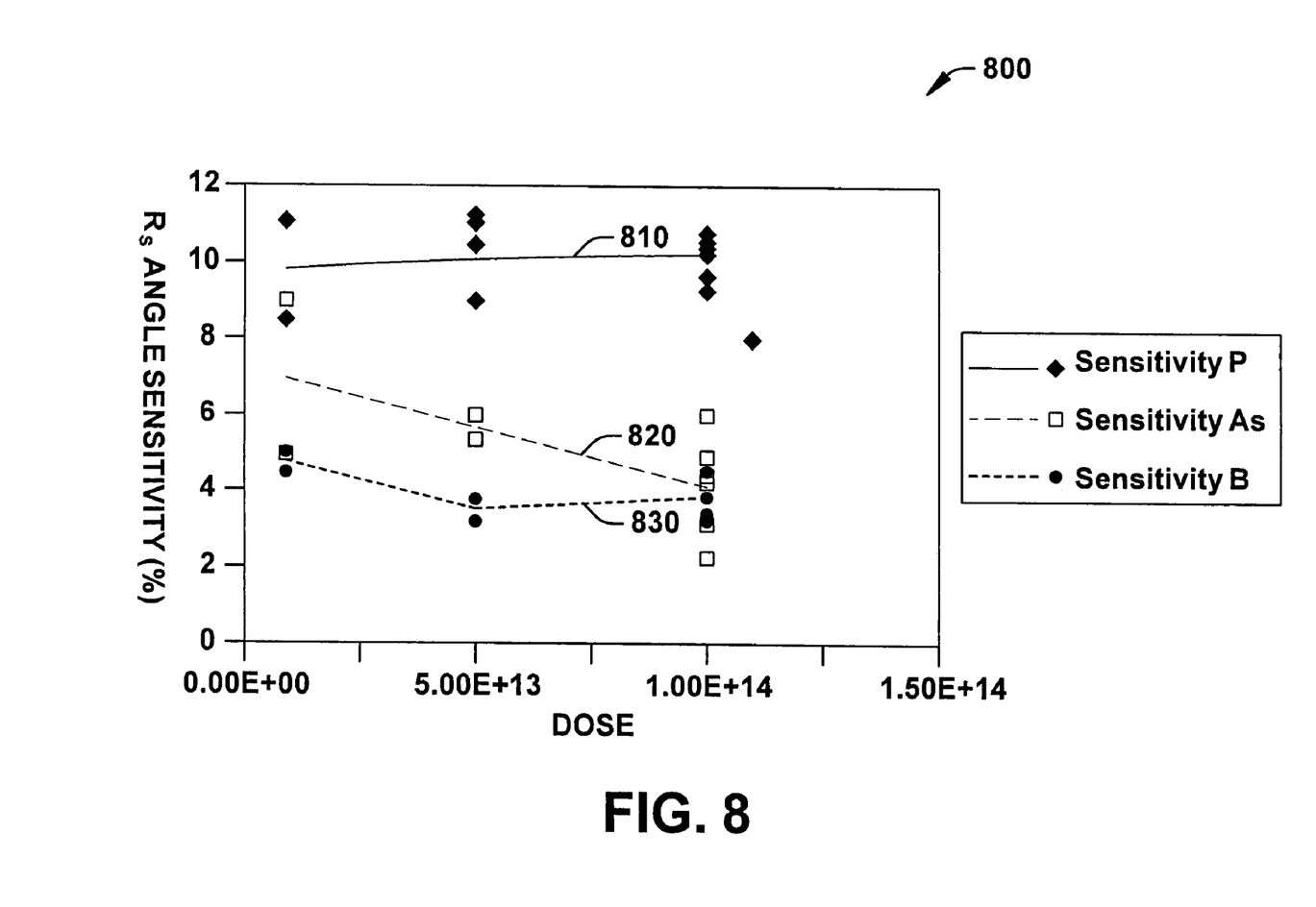
FIG. 8 illustrates a plot comparing the sheet resistance implant angle sensitivity of several dopant ion species to a range of dose levels in accordance with one or more aspects of the present invention.

FIG. 8 illustrates a plot 800 comparing the sheet resistance $R_S$ implant angle sensitivity of P, As, and B dopant ion species over a range of dose levels in accordance with one or more aspects of the present invention. For example, each of the P, As, and B dopant ions are implanted at dose levels of 1E13 ions/cm$^2$, 5E13 ions/cm$^2$, and 1E14 ions/cm$^2$. Accordingly, the inventors of the present invention have appreciated that phosphorus is beneficially, relatively insensitive to dose level, thereby providing a relatively flat average angle sensitivity (810) to dose level in the range utilized. By contrast, the dose sensitivity of As (820) and B (830) exhibits a more pronounced slope or non-linear response.

It will be noted that the methods 300 and 400 illustrated and described above are exemplary in nature, and that many alternative orderings of various implantation steps may be made in accordance with the spirit and scope of the present invention. In addition, the invention is not limited to single or batch wafer implanters, and may be implemented in association with the manufacture of semiconductor devices, wherein the various aspects thereof may be applied in fabricating transistors and the like.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and/or the claims, such terms are intended to be inclusive in a manner similar to the term "comprising."

What is claimed is:

1. A method of calibrating an angle of implantation in an ion implanter comprising:
   implanting phosphorous ions into a first of at least three wafers using the ion implanter at an initial implantation angle to form a conductive sheet in the wafer;
   repeatedly changing the implantation angle and implanting a second and a third wafer of the at least three wafers with phosphorous ions until each wafer is implanted at a different implant angle;
   measuring a sheet resistance of the implanted wafers;
   evaluating a difference between the sheet resistances of the wafers at each corresponding implant angle to obtain a functional relationship between the sheet resistance and the implant angle; and
   calibrating the implantation angle of the ion implanter based on the functional relationship.

2. The method of claim 1, further comprising providing two or more wafers for implantation at each of three or more implant angles, and an initial implant angle.

3. The method of claim 1, wherein the wafers comprise a pilot wafer.

4. The method of claim 1, wherein one or more wafers are attached to a wafer platen in the ion implanter for calibration of the angle of the wafer platen relative to the ion beam therein.

5. A method of calibrating an angle of implantation in an ion implanter comprising;
   implanting phosphorous ions into a first of at least three wafers using the ion implanter at an initial implantation angle to form a conductive sheet in the wafer;
   repeatedly changing the implantation angle and implanting a second and a third wafer of the at least three wafers with phosphorous ions until each wafer is implanted at a different implant angle;
   measuring a sheet resistance of the implanted wafers;
   evaluating a difference between the sheet resistances of the wafers at each corresponding implant angle to obtain a functional relationship between the sheet resistance and the implant angle; and
   calibrating the implantation angle of the ion implanter based on the functional relationship, wherein the wafers comprise a p-doped substrate.

6. The method of claim 1, wherein measuring the sheet resistance of the implanted wafers comprises: measuring the sheet resistance of each wafer at one or more points using a four-point probe; and averaging the sheet resistance measurements from each wafer.

7. The method of claim 6, further comprising: averaging the sheet resistance measurements of the wafers implanted at each corresponding implantation angle.

8. The method of claim 1, wherein evaluating the difference between the sheet resistances of the waters at each corresponding implant angle to determine a functional relationship between the sheet resistance and the implantation angle comprises:
   averaging the sheet resistance measurements of the implanted wafers at each corresponding implantation angle;
   determining a lowest sheet resistance point by an interpolation method which corresponds to a real zero degree implant angle;
   calculating the difference between the real zero degree angle and a current zero degree angle of an implanter platen; and
   adjusting the implanter platen angle to the real zero degree angle with the calculated difference and a direction indicated by the calculation results.

9. The method of claim 1, wherein calibrating the implantation angle of the implanter based on the functional relationship comprises:
   determining a lowest sheet resistance value for the functional relationship;
   normalizing the functional relationship to the lowest sheet resistance value;
   identifying a sheet resistance associated with wafers having a positive and negative implant angle with respect to the wafer having the lowest sheet resistance; and
   calibrating to a zero degree implantation angle of the implanter using the lowest sheet resistance value and a difference between the sheet resistances of the wafers having the positive and negative implant angles.

10. The method of claim 9, wherein calibrating a zero degree implantation angle of the implanter to coincide with the lowest sheet resistance value comprises: adjusting the zero degree implantation angle of the implanter until the lowest average sheet resistance measurement of subsequent wafer implantations coincides with the lowest value of the functional relationship.

11. The method of claim 1, wherein calibrating the implantation angle of the implanter based on the functional relationship comprises:
   plotting the relationship of the sheet resistance and the implantation angle;
   determining a lowest sheet resistance on the plot;
   normalizing the plot to the lowest sheet resistance;
   identifying a sheet resistance associated with wafers having a positive and negative implant angle with respect to the wafer having the lowest sheet resistance; and
   calibrating to a zero degree implantation angle of the implanter using the lowest sheet resistance measurement and a difference between the sheet resistances of the wafers having the positive and negative implant angles.

12. The method of claim 1, wherein the phosphorous implantation dose is about 1E12 ions/cm$^2$ or more and about 5E15 ions/cm$^2$ or less.

13. The method of claim 1, wherein the implantation energy is about 5 KeV or more and about 3000 KeV or less.

14. The method of claim 1, wherein the implantation condition is about 150 KeV/1E14.

15. The method of claim 1, wherein the phosphorous implantation comprises a dose of about 1E12 to about 5E15 ions/cm$^2$ and an implantation energy of about 5 KeV to about 3000 keV.

16. The method of claim 1, wherein three or more wafers are implanted at each implant angle.

17. The method of claim 1, wherein at least one of the three or more implant angles is at or near the zero degree implantation angle.

18. The method of claim 1, wherein the wafers are implanted about the time of a dose qualification process or during preventative maintenance of the implanter.

19. The method of claim 1, wherein the ion implanter is one of a single wafer implanter and a batch implanter.

20. A method of characterizing an implantation angle in a wafer comprising:

implanting phosphorous ions into a first of at least three wafers using the ion implanter at an initial implantation angle to form a conductive sheet in the wafer;

repeatedly changing the implantation angle and implanting a second and a third wafer of the at least three wafers with phosphorous ions until each wafer is implanted at a different implant angle;

measuring the sheet resistance of each implanted wafer at one or more points using a four-point probe;

averaging the sheet resistance measurements of the implanted wafers at each corresponding implantation angle;

determining a lowest sheet resistance average from the plurality of implanted wafers;

calibrating a zero degree implantation angle of the implanter to coincide with the lowest sheet resistance value;

evaluating an angle difference between the lowest sheet resistance average and a current zero implantation angle; and adjusting a platen angle of the implanter to a real zero degree angle corresponding to the lowest sheet resistance value.

* * * * *